(12) United States Patent
Lo et al.

(10) Patent No.: US 7,246,018 B1
(45) Date of Patent: Jul. 17, 2007

(54) INTERPOLATOR TESTING CIRCUIT

(75) Inventors: William Lo, Cupertino, CA (US);
Francis Campana, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 97 days.

(21) Appl. No.: 10/852,540

(22) Filed: May 24, 2004

Related U.S. Application Data

(60) Provisional application No. 60/531,902, filed on Dec. 22, 2003.

(51) Int. Cl.
*G01R 29/26* (2006.01)
(52) U.S. Cl. .......................... 702/72; 702/69; 702/125
(58) Field of Classification Search ................ 702/72, 702/69, 125, 126
See application file for complete search history.

(56) References Cited

U.S. PATENT DOCUMENTS

| | | | |
|---|---|---|---|
| 6,397,042 B1* | 5/2002 | Prentice et al. ........ 455/67.14 |
| 6,901,126 B1* | 5/2005 | Gu ........................ 375/355 |
| 6,927,611 B2* | 8/2005 | Rhee et al. ............. 327/149 |
| 6,973,149 B2* | 12/2005 | Fyvie ..................... 375/364 |
| 6,993,108 B1* | 1/2006 | Chi et al. ............... 375/376 |
| 2002/0090045 A1* | 7/2002 | Hendrickson ........... 375/376 |
| 2004/0114632 A1* | 6/2004 | Yuuki et al. ............ 370/503 |
| 2004/0203559 A1* | 10/2004 | Stojanovic et al. ..... 455/403 |
| 2004/0223571 A1* | 11/2004 | Donnelly et al. ....... 375/371 |
| 2004/0264612 A1* | 12/2004 | Allen ...................... 375/354 |
| 2005/0060616 A1* | 3/2005 | Cho et al. ............... 714/34 |
| 2005/0134305 A1* | 6/2005 | Stojanovic et al. ...... 326/31 |

* cited by examiner

*Primary Examiner*—Marc S. Hoff
*Assistant Examiner*—Anthony Gutierrez

(57) ABSTRACT

An interpolator testing system and method comprises an interpolator that includes a phase shift module. The phase shift module receives a reference clock signal and generates M clock signals having phase shifts in increments of 360/M degrees relative to the reference clock signal. A phase select module receives the reference clock signal and a recovered clock signal during a normal mode and generates a select signal based on a comparison of the reference clock signal and the recovered clock signal during the normal mode. A selector receives the M clock signals and outputs one of the M clock signals as the recovered clock signal based on the select signal. A recovered clock counter counts an attribute of the recovered clock signal during a test mode. The phase select module sequentially selects the M clock signals N times during the test mode.

30 Claims, 6 Drawing Sheets

INTERPOLATOR TESTING CIRCUIT

CROSS-REFERENCE TO RELATED APPLICATIONS

This application claims the benefit of U.S. Provisional Application No. 60/531,902, filed on Dec. 22, 2003, which is hereby incorporated by reference in its entirety.

FIELD OF THE INVENTION

The present invention relates to data communications devices, and more particularly to an interpolator testing system for a serializer/deserializer data communications devices.

BACKGROUND OF THE INVENTION

Data communications devices such as Ethernet network devices typically include a serializer/deserializer (SERDES) device. SERDES devices include a serializer that converts a parallel data stream into serial data stream on a transmit side. The SERDES also include a deserializer that converts a serial data stream into a parallel data stream on a receive side. The serial data stream that is generated by the SERDES includes an embedded clock signal. Circuits associated with the deserializer recover the embedded clock signal.

Referring to FIG. 1, a data communications device 10 includes a SERDES device 12 that receives and sends parallel data with another device 14, such as a medium access control (MAC) device, a physical layer (PHY) device and/or other suitable devices. The SERDES device 12 includes a serializer device 16 and a deserializer device 18. The serializer device 16 receives a parallel data stream from the device 14 and converts the parallel data stream into a serial data stream. The deserializer device 18 receives a serial data stream and converts the serial data stream into a parallel data stream. The deserializer device 18 outputs the parallel data stream to the device 14 for processing.

A clock generator 20 generates a reference clock signal. For example, the clock generator 20 may include an crystal oscillator (XOSC). A phase-locked loop (PLL) device 22 and the serializer 16 receive a reference clock signal 24 from the clock generator 20. The PLL device 22 includes an interpolator device 25, which adjusts the phase of the reference clock signal 24 to match a recovered clock signal in the received serial data stream.

Referring now to FIG. 2, the SERDES device 12 is usually tested following manufacture and/or during use to verify proper operation. For example, the parallel data stream that is recovered by a deserializer device 18 may be required to have a minimum number of errors when a test signal is transmitted to the deserializer device 18. An automatic testing equipment (ATE) system 32 is typically employed to test the SERDES device 12. The ATE system 32 generates the test signal that is output to the serializer 16. The output of the serializer device 16 is looped back to the deserializer device 18 and is compared to the test signal. If the two sufficiently match, the SERDES 12 passes the test. If not, the SERDES 12 fails the test.

The exemplary ATE system 32 includes a data generator 34 that communicates with a data checker 36. The data generator 34 generates the parallel test signal and outputs the parallel test signal to the serializer device 16. The serializer device 16 converts the parallel test signal into a serial data stream. The output of the serializer device 16 is looped back to the input of the deserializer device 18. The deserializer device 18 converts the serial data stream into a recovered parallel data stream.

The data checker 36 receives the recovered parallel data stream and compares the recovered parallel data stream with the parallel test data signal from the data generator 34 to verify proper operation of the SERDES device 12. The data generator 34 and the data checker 36 may also be included in a built-in self-test module in the SERDES device 12, which may be utilized to test the SERDES device 12.

Referring now to FIG. 3, the interpolator device 25 communicates with the deserializer device 18 and includes a phase select module 50, a phase shift module 52 and a phase selector 54. The phase shift module 52 receives the reference clock signal 24 and generates M clock signals that are offset in phase by 360/M degrees. One of the M clock signals is selected as a recovered clock signal 55. The phase select module 50 receives the recovered clock signal 55 and the reference clock signal 24 and generates a select signal 56, which selects one of the M clock signals. The M clock signals that are output by the phase shift module 52 are input to the phase selector 54, which receives the select signal 56 from said phase select module 50.

The phase select module 50 detects when signal drift occurs and adjusts the select signal 56 to advance or delay a phase of the recovered clock signal 55. The select signal 56 selects a specific phase-shifted copy of the reference clock signal 24 that is output by the selector 54 so that the reference clock signal 24 and the recovered clock signal 55 are synchronized.

The ATE system 32 tests the SERDES device 12 under simulated conditions. However, one important function of the deserializer device 18 is clock recovery. During normal operations, the deserializer device 18 synchronizes the recovered clock signal in the serial data stream with the reference clock signal. Since the output of the serializer device 16 is looped back to the deserializer device 18, the interpolator device 25 is not tested sufficiently. In other words, the serializer device 16 is frequency-locked with the deserializer device 18. If there is a manufacturing defect in the interpolator device 25 or in the phase shift module 52 that generate copies of the reference clock signal, the testing by the ATE system 32 will not detect these errors.

SUMMARY OF THE INVENTION

An interpolator testing system and method comprises an interpolator that includes a phase shift module. The phase shift module receives a reference clock signal and generates M clock signals having phase shifts in increments of 360/M degrees relative to the reference clock signal. A phase select module receives the reference clock signal and a recovered clock signal during a normal mode and generates a select signal based on a comparison of the reference clock signal and the recovered clock signal during the normal mode. A selector receives the M clock signals and outputs one of the M clock signals as the recovered clock signal based on the select signal. A recovered clock counter counts an attribute of the recovered clock signal during a test mode. The phase select module sequentially selects the M clock signals N times during the test mode.

In other features, after the test mode, the phase select module compares a product of M×N to a count value in the recovered clock counter and determines operability of the interpolator based on the comparison. After the test mode, the phase select module determines operability of the interpolator based on at least two least significant bits (LSBs) of a count value in the recovered clock counter. After the test mode, the phase select module compares a difference between a product of M×N and a count value in the recovered clock counter to a first threshold and determines operability of the interpolator based on the comparison.

In still other features, the phase select module generates a test fail signal when the difference is one of less than the first threshold and greater than a second threshold. The phase select module generates a test pass signal when the difference is one of greater than or equal to the first threshold and less than or equal to a second threshold.

A serializer/deserializer comprises the interpolator testing system. A network device comprises the serializer/deserializer. A phase-locked loop comprises the interpolator testing system.

An interpolator testing system comprises an interpolator that includes a phase shift module. The phase shift module receives a reference clock signal and generates M clock signals having phase shifts in increments of 360/M degrees relative to the reference clock signal. A phase select module receives the reference clock signal and a recovered clock signal during a normal mode and generates a select signal based on a comparison of the reference clock signal and the recovered clock signal during the normal mode. A selector receives the M clock signals and outputs one of the M clock signals as the recovered clock signal based on the select signal. A recovered clock counter counts an attribute of the recovered clock signal during a test mode. A test module communicates with the selector and sequentially selects the M clock signals N times during the test mode.

In other features, after the test mode, the test module compares a product of M×N and a count value in the recovered clock counter and determines operability of the interpolator based on the comparison. After the test mode, the test module determines operability of the interpolator based on at least two least significant bits (LSBs) of a count value in the recovered clock counter. After the test mode, the test module compares a difference between a product of M×N and a count value in the recovered clock counter to a first threshold and determines operability of the interpolator based on the comparison. The test module generates a test fail signal when the difference is one of less than the first threshold and greater than a second threshold. The test module generates a test pass signal when the difference is one of greater than or equal to the first threshold and less than or equal to a second threshold.

A serializer/deserializer comprises the interpolator testing system. A network device comprises the serializer/deserializer. A phased-lock loop comprises the interpolator testing system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
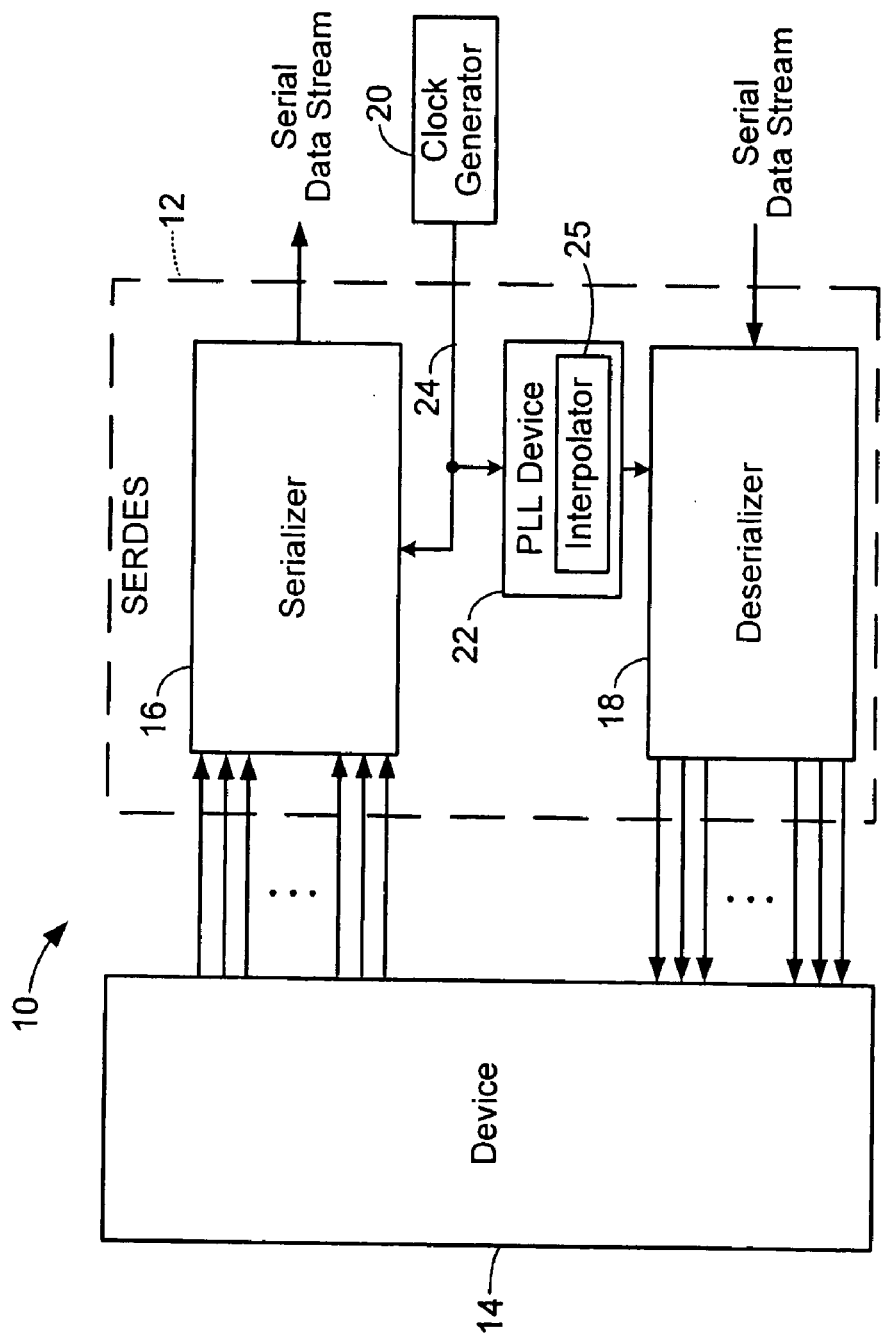
FIG. 1 is a functional block diagram of a data communications device that includes a serializer/deserializer (SERDES) device according to the prior art.
Figure 2:
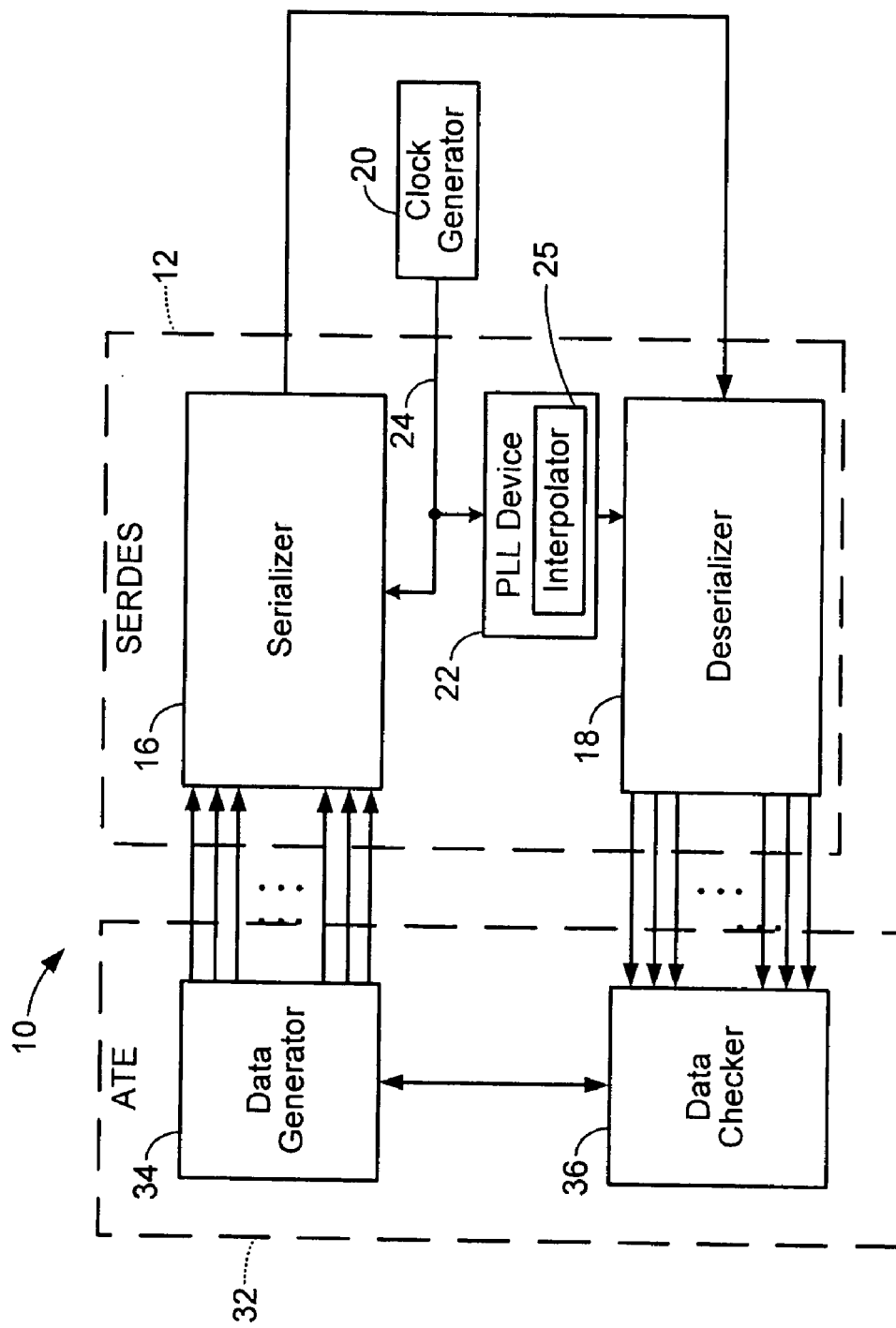
FIG. 2 is a functional block diagram of an automatic testing equipment (ATE) system that tests the SERDES device of FIG. 1 according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term device and/or module refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 4A:
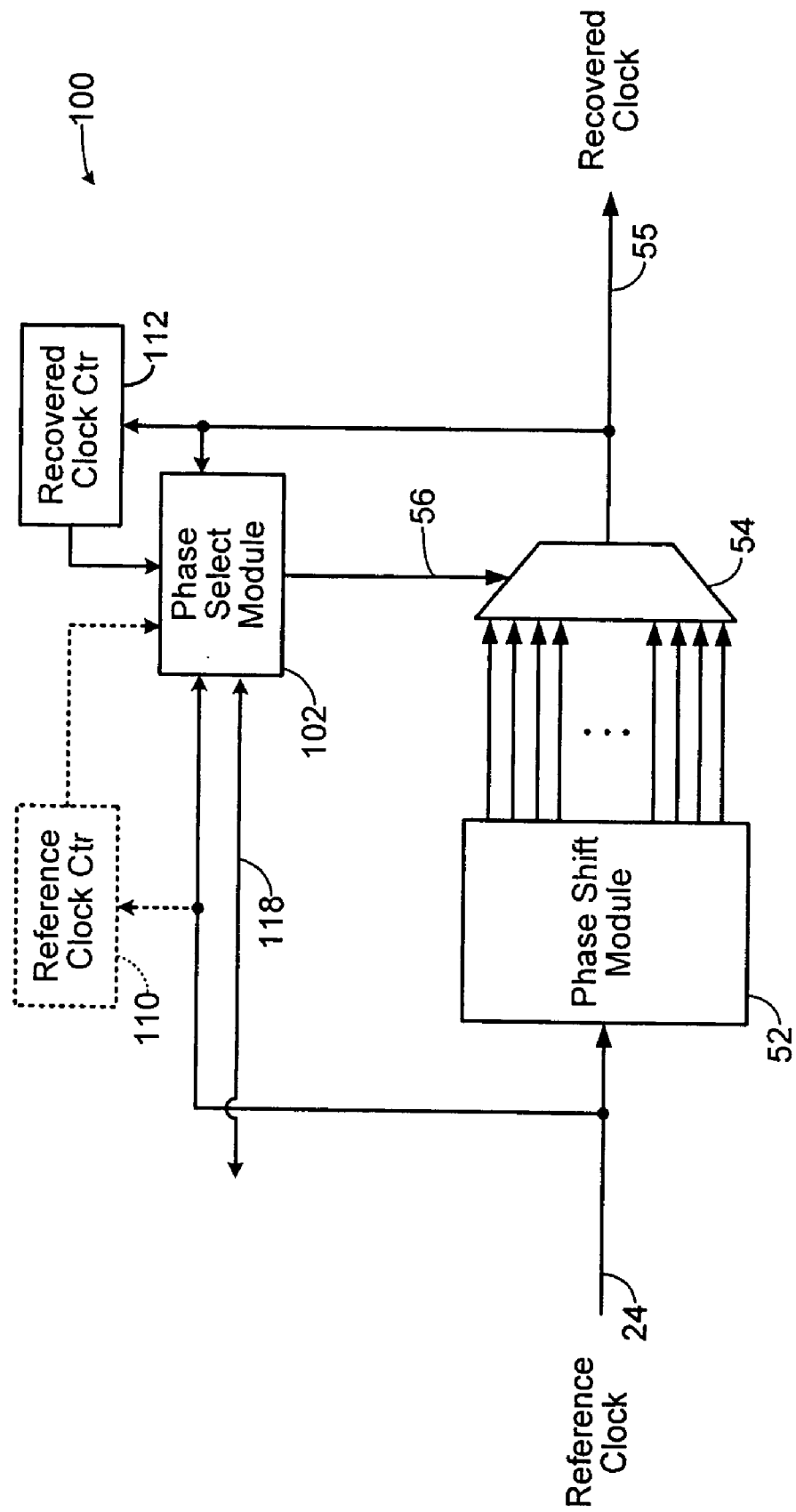
FIGS. 4A and 4B are functional block diagrams of interpolator devices according to the present invention.

Referring now to FIG. 4A, an interpolator device 100 according to the present invention is shown to include a phase select module 102 having a normal mode and a test mode. The phase select module 102 communicates with an optional reference clock counter 110, which receives and counts an attribute of the reference clock signal 24 during the test mode. The phase select module 102 also communicates with a recovered clock counter 112, which receives and counts an attribute of the recovered clock 55 that is output by the phase selector 54 during the test mode. The attribute can be rising edges, falling edges or other waveform characteristics from which cycle information can be derived.

Figure 3:
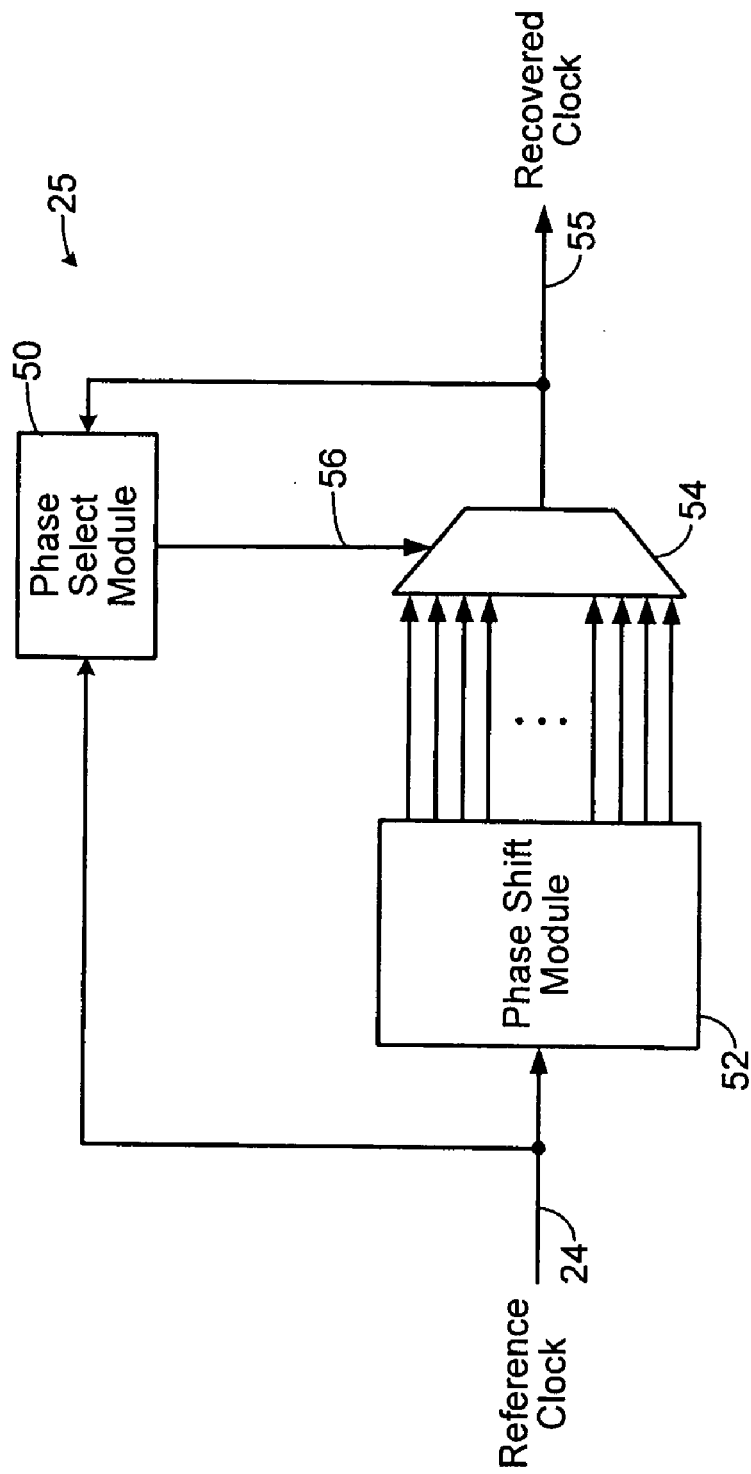
FIG. 3 is a functional block diagram of the interpolator device of FIGS. 1 and 2 according to the prior art.

In the normal mode, the phase select module 102 operates as described above in conjunction with FIG. 3. In the test mode, the ATE system 32 or another device triggers the phase select module 102 to initiate testing. The phase select module 102 increases or decreased the phase of the recovered clock signal from 0 . . . M or from M . . . 0 N times in a row. At the end of the test mode, the difference between the counters 110 and 112 should be ±N ±1. Alternately, if the reference clock counter 110 is omitted, a difference can be generated between a product of M×N and the count in the recovered clock counter 112. Depending upon the value of M and N and the number of bits of the recovered clock counter 112, one or more least significant bits (LSBs) may be used to identify whether the correct count is achieved. The phase select module 102 compares the difference or the LSBs of the counter value at the end of the test mode to one or more thresholds. For example, if the difference is between first and second thresholds, the interpolator is operating correctly. Otherwise the interpolator device 100 is not operating correctly. The phase select module 102 generates a test OK or test fail signal 118 for the ATE system 32 or another device. For example, when M=128 and N=13, the 4 LSBs of recovered clock counter should have a value of 3 or 4 or 13 or 14 depending on whether the counter is incremented or decremented.

Figure 4B:
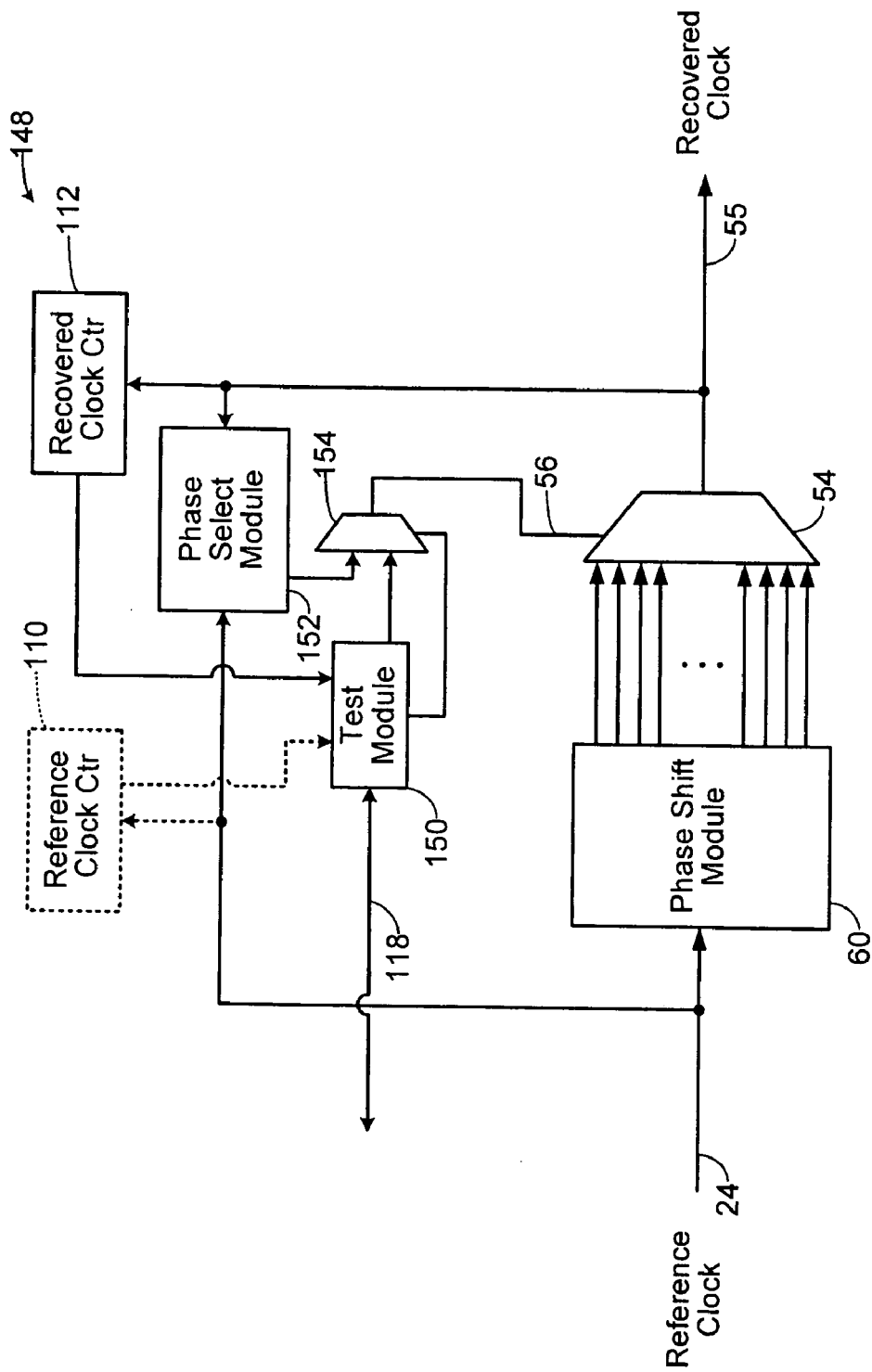

Referring now to FIG. 4B, an interpolator device 148 according to the present invention is shown to include a test module 150 and a phase select module 152. The interpolator device 148 has a normal mode and a test mode. The test module 150 communicates with the optional reference clock counter 110, which receives and counts an attribute of the reference clock signal 24 during test mode. The test module 150 also communicates with the recovered clock counter 112, which receives and counts an attribute of the recovered clock 55 that is output by the phase selector 54 during the test mode. The attribute can be rising edges, falling edges or other waveform characteristics from which cycle information can be derived.

The test module 150 and the phase select module 152 generate the select signal 56 during the test mode and normal mode, respectively. A selector 154 such as a multiplexer can be used to select from the select signal outputs of the test and phase select modules 150 and 152, respectively. The test module 150, the ATE system 32 or another module or device can be used to initiate the test mode.

In the normal mode, the phase select module 152 operates as described above in conjunction with FIG. 3. In the test mode, the ATE system 32 triggers the test module 150 to initiate testing. The test module 150 uses a similar approach described above. The test module 150 compares the difference or the LSBs of the recovered clock counter 112 at the end of the test mode to one or more thresholds. If the difference or LSBs are between first and second thresholds, the interpolator device 148 is operating correctly. Otherwise the interpolator device 148 is not operating correctly. The test module 150 generates a test OK or test fail signal for the ATE system 32.

Figure 5:
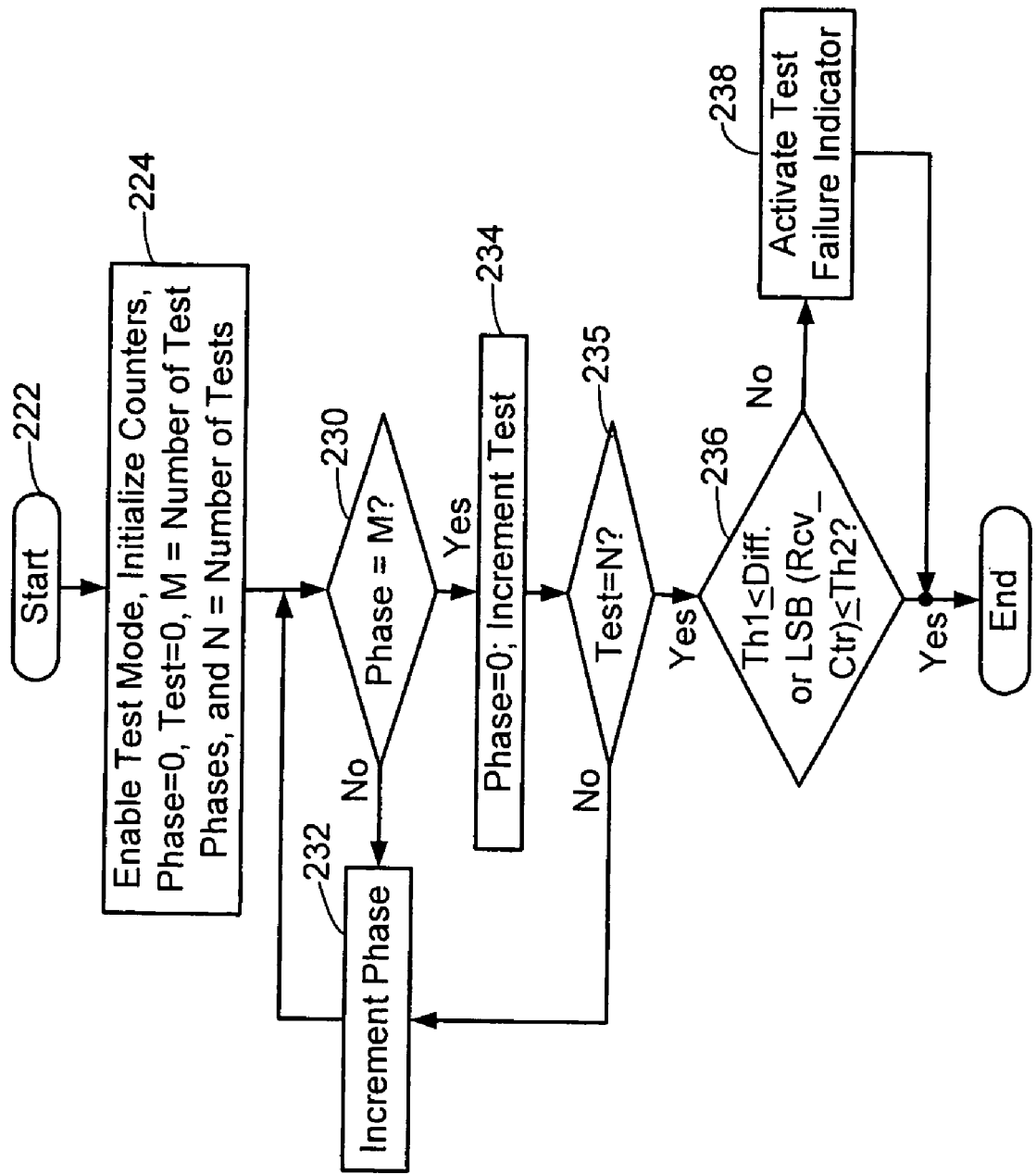
FIG. 5 is a flowchart illustrating steps performed by the interpolator devices of FIGS. 4A and 4B.

Referring now to FIG. 5, an exemplary testing algorithm executed by the test module or the phase select module begins in step 222. In step 224, control enables the test mode and initializes counters. M is set equal to the number of copies or phases of the reference clock signal. Control also sets N equal to the number of times to cycle through the phases. Control waits until the reference clock stabilizes and then enables the counters. In step 230, control determines whether the phase is equal to M. If not, control increases or decreases the phase of the recovered clock signal with respect to the reference clock signal in step 232. If step 230 is true, control sets Phase=0 and increments Test. In step 235, control determines if Test=N. If not, control returns to step 232. If step 235 is true, control disables the counters and determines whether the difference between the recovered counter and reference counter (or M×N or the value of one or more LSB of the recovered clock counter) is between first and second thresholds in step 236. If step 236 is true, control ends. If step 236 is false, control proceeds to step 238, activates a test failure indicator and control ends.

The present invention tests the operation of the interpolator and phase shift modules of a deserializer device and reduces the risk of undiscovered manufacturing defects. Additionally, the conventional methods for testing SERDES devices may still be employed to stress the entire data path. While the present invention describes testing of the interpolator and phase shift modules using a test module and/or phase shift module, skilled artisans will appreciate that these functions can be implemented by other devices or modules in the interpolator device, the SERDES, the ATE system and/or other components of the network device.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. An interpolator testing system, comprising:
   an interpolator that comprises:
   a phase shift module that receives a reference clock signal and that generates M clock signals having phase shifts in increments of 360/M degrees relative to said reference clock signal;
   a phase select module that receives said reference clock signal and a recovered clock signal during a normal mode and that generates a select signal based on a comparison of said reference clock signal and said recovered clock signal during said normal mode; and
   a selector that receives said M clock signals and that outputs one of said M clock signals as said recovered clock signal based on said select signal; and
   a recovered clock counter that counts an attribute of said recovered clock signal during a test mode, wherein said phase select module sequentially selects said M clock signals N times during said test mode.

2. The interpolator testing system of claim 1 wherein, after said test mode, said phase select module compares a product of M×N to a count value in said recovered clock counter and determines operability of said interpolator based on said comparison.

3. The interpolator testing system of claim 1 wherein, after said test mode, said phase select module determines operability of said interpolator based on at least two least significant bits (LSBs) of a count value in said recovered clock counter.

4. The interpolator testing system of claim 1 wherein, after said test mode, said phase select module compares a difference between a product of M×N and a count value in said recovered clock counter to a first threshold and determines operability of said interpolator based on said comparison.

5. The interpolator testing system of claim 4 wherein said phase select module generates a test fail signal when said difference is one of less than said first threshold and greater than a second threshold.

6. The interpolator testing system of claim 4 wherein said phase select module generates a test pass signal when said difference is greater than or equal to said first threshold and less than or equal to a second threshold.

7. An interpolator testing system comprising:
   an interpolator that comprises:
   a phase shift module that receives a reference clock signal and that generates M clock signals having phase shifts in increments of 360/M degrees relative to said reference clock signal;
   a phase select module that receives said reference clock signal and a recovered clock signal during a normal mode and that generates a select signal based on a comparison of said reference clock signal and said recovered clock signal during said normal mode; and
   a selector that receives said M clock signals and that outputs one of said M clock signals as said recovered clock signal based on said select signal; and
   a recovered clock counter that counts an attribute of said recovered clock signal during a test mode; and
   a test module that communicates with said selector and that sequentially selects said M clock signals N times during said test mode.

8. The interpolator testing system of claim 7 wherein, after said test mode, said test module compares a product of M×N and a count value in said recovered clock counter and determines operability of said interpolator based on said comparison.

9. The interpolator testing system of claim 7 wherein, after said test mode, said test module determines operability of said interpolator based on at least two least significant bits (LSBs) of a count value in said recovered clock counter.

10. The interpolator testing system of claim 7 wherein, after said test mode, said test module compares a difference between a product of M×N and a count value in said recovered clock counter to a first threshold and determines operability of said interpolator based on said comparison.

11. The interpolator testing system of claim 10 wherein said test module generates a test fail signal when said difference is one of less than said first threshold and greater than a second threshold.

12. The interpolator testing system of claim 10 wherein said test module generates a test pass signal when said difference is greater than or equal to said first threshold and less than or equal to a second threshold.

13. An interpolator testing system, comprising:
  interpolating means for interpolating that comprises:
    phase shifting means for receiving a reference clock signal and for generating M clock signals having phase shifts in increments of 360/M degrees relative to said reference clock signal;
    phase selecting means for receiving said reference clock signal and a recovered clock signal during a normal mode and for generating a select signal based on a comparison of said reference clock signal and said recovered clock signal during said normal mode; and
    selecting means for receiving said M clock signals and for outputting one of said M clock signals as said recovered clock signal based on said select signal; and
  recovered clock counting means for counting an attribute of said recovered clock signal during a test mode, wherein said phase selecting means sequentially selects said M clock signals N times during said test mode.

14. The interpolator testing system of claim 13 wherein, after said test mode, said phase selecting means compares a product of M×N to a count value in said recovered clock counting means and determines operability of said interpolator means based on said comparison.

15. The interpolator testing system of claim 13 wherein, after said test mode, said phase selecting means determines operability of said interpolator means based on at least two least significant bits (LSBs) of a count value in said recovered clock counting means.

16. The interpolator testing system of claim 13 wherein, after said test mode, said phase selecting means compares a difference between a product of M×N and a count value in said recovered clock counting means to a first threshold and determines operability of said interpolator means based on said comparison.

17. The interpolator testing system of claim 16 wherein said phase selecting means generates a test fail signal when said difference is one of less than said first threshold and greater than a second threshold.

18. The interpolator testing system of claim 16 wherein said phase selecting means generates a test pass signal when said difference is greater than or equal to said first threshold and less than or equal to a second threshold.

19. An interpolator testing system comprising:
  interpolator means for interpolating comprising:
    phase shifting means for receiving a reference clock signal and for generating M clock signals having phase shifts in increments of 360/M degrees relative to said reference clock signal;
    phase selecting means for receiving said reference clock signal and a recovered clock signal during a normal mode and for generating a select signal based on a comparison of said reference clock signal and said recovered clock signal during said normal mode; and
    selecting means for receiving said M clock signals and for outputting one of said M clock signals as said recovered clock signal based on said select signal; and
  recovered clock counting means for counting an attribute of said recovered clock signal during a test mode; and
  test means for communicating with said selecting means and for sequentially selecting said M clock signals N times during said test mode.

20. The interpolator testing system of claim 19 wherein, after said test mode, said test means compares a product of M×N and a count value in said recovered clock counting means and determines operability of said interpolator means based on said comparison.

21. The interpolator testing system of claim 19 wherein, after said test mode, said test means determines operability of said interpolator means based on at least two least significant bits (LSBs) of a count value in said recovered clock counting means.

22. The interpolator testing system of claim 19 wherein, after said test mode, said test means compares a difference between a product of M×N and a count value in said recovered clock counting means to a first threshold and determines operability of said interpolator means based on said comparison.

23. The interpolator testing system of claim 22 wherein said test means generates a test fail signal when said difference is one of less than said first threshold and greater than a second threshold.

24. The interpolator testing system of claim 22 wherein said test means generates a test pass signal when said difference is greater than or equal to said first threshold and less than or equal to a second threshold.

25. A method for testing an interpolator comprising:
  receiving a reference clock signal;
  generating M clock signals having phase shifts in increments of 360/M degrees relative to said reference clock signal;
  generating a select signal based on a comparison of said reference clock signal and said recovered clock signal during a normal mode;
  outputting one of said M clock signals as said recovered clock signal based on said select signal;
  counting an attribute of said recovered clock signal during a test mode; and
  sequentially selecting said M clock signals N times during said test mode.

26. The method of claim 25 further comprising:
  comparing a product of M×N to a count value of said attribute after said test mode; and
  determining operability of said interpolator based on said comparison.

27. The method of claim 25 further comprising determining operability of said interpolator based on at least two least significant bits (LSBs) of a count value of said attribute after said test mode.

28. The method of claim 25 further comprising:
comparing a difference between a product of M×N and a count value in said recovered clock counting means to a first threshold after said test mode; and
determining operability of said interpolator based on said comparison.

29. The method of claim 28 further comprising generating a test fail signal when said difference is one of less than said first threshold and greater than a second threshold.

30. The method of claim 28 further comprising generating a test pass signal when said difference is greater than or equal to said first threshold and less than or equal to a second threshold.

* * * * *